(12) United States Patent
Ahn et al.

(10) Patent No.: US 10,039,160 B2
(45) Date of Patent: Jul. 31, 2018

(54) LIGHT ENGINE FOR LIGHT EMITTING ELEMENT

(71) Applicant: Point Engineering Co., Ltd., Asan-si (KR)

(72) Inventors: Bum Mo Ahn, Suwon-si (KR); Seung Ho Park, Hwaseong-si (KR); Tae Hwan Song, Cheonan-si (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 162 days.

(21) Appl. No.: 15/142,189

(22) Filed: Apr. 29, 2016

(65) Prior Publication Data

US 2016/0334080 A1 Nov. 17, 2016

(30) Foreign Application Priority Data

May 14, 2015 (KR) .......................... 10-2015-0067430

(51) Int. Cl.
*F21V 15/00* (2015.01)
*H05B 33/08* (2006.01)
(Continued)

(52) U.S. Cl.
CPC ........... *H05B 33/0815* (2013.01); *F21K 9/00* (2013.01); *F21V 23/005* (2013.01); *F21V 29/70* (2015.01); *H05B 33/0803* (2013.01); *F21Y 2115/10* (2016.08); *H05K 1/0209* (2013.01); *H05K 2201/10106* (2013.01); *Y02B 20/341* (2013.01)

(58) Field of Classification Search
CPC .......... F21K 9/00; F21V 23/005; F21V 29/70; F21Y 2115/10; H05B 33/0803; H05B 33/0815; H05K 1/0209; H05K 2201/10106; Y02B 20/341
See application file for complete search history.

(56) References Cited

U.S. PATENT DOCUMENTS

| 7,055,996 B2 * | 6/2006 | Pond ........................ B60Q 1/32 362/243 |
| 8,246,201 B2 * | 8/2012 | Dumas ................. H05K 1/0209 362/249.01 |

(Continued)

FOREIGN PATENT DOCUMENTS

| JP | 3185532 | 8/2013 | ............... H05K 9/00 |
| KR | 10-2013-0068107 | 6/2013 | ............. H01L 27/15 |

OTHER PUBLICATIONS

Korean Intellectual Patent Office, Office Action: Korean Application No. 10-2015-0067430, dated Sep. 19, 2016, 4 pages.

(Continued)

*Primary Examiner* — Peggy Neils
(74) *Attorney, Agent, or Firm* — Sunstein Kann Murphy & Timbers LLP

(57) ABSTRACT

A light engine for a light emitting element includes an element substrate on which a plurality of light emitting elements is mounted, a plurality of circuit substrates connected to one another in an insulated state in order to apply a drive voltage to the light emitting elements and connected to the element substrate in an insulated state, and a plurality of protection substrates configured to surround the element substrate and the circuit substrates and to make contact with the element substrate and the circuit substrates in an insulated state.

6 Claims, 6 Drawing Sheets

(51) Int. Cl.
    *F21V 29/70* (2015.01)
    *F21K 9/00* (2016.01)
    *F21V 23/00* (2015.01)
    *H05K 1/02* (2006.01)
    *F21Y 115/10* (2016.01)

(56) References Cited

U.S. PATENT DOCUMENTS

| | | | | |
|---|---|---|---|---|
| 8,858,022 | B2* | 10/2014 | Jiang | F21V 13/04 |
| | | | | 362/235 |
| 9,273,853 | B2* | 3/2016 | Treanton | F21S 2/005 |
| 9,538,589 | B2* | 1/2017 | Shank | H05B 33/0803 |
| 2016/0320042 | A1* | 11/2016 | Hsing Chen | H05B 33/06 |

OTHER PUBLICATIONS

Korean Intellectual Patent Office, Office Action—Korean Application No. 10-2015-0067430, dated Sep. 19, 2016, 3 pages (English translation of main parts of Office Action).

\* cited by examiner

A − A'

B − B'

LIGHT ENGINE FOR LIGHT EMITTING ELEMENT

CROSS-REFERENCE TO RELATED PATENT APPLICATION

This U.S. non-provisional patent application claims priority under 35 U.S.C. § 119 of Korean Patent Application No. 10-2015-0067430 filed on May 14, 2015 in the Korean Patent Office, the entire contents of which are hereby incorporated by reference.

BACKGROUND

1. Technical Field

The present invention relates to a light engine for a light emitting element.

2. Description of Related Art

A light emitting element includes a light emitting diode, a semiconductor laser and the like. The light emitting element is combined with and packaged with a relevant control device. In recent years, a light emitting diode is often used as the light emitting element. The light emitting diode has characteristics of a diode and emits red light, green light or blue light when an electric current is allowed to flow through the light emitting diode.

The light emitting diode tends to be widely used because the light emitting diode is longer in a lifespan, faster in a response to a current flow and smaller in power consumption than a filament bulb.

In general, a light emitting element can be driven only by a DC power source due to the diode characteristics thereof. Thus, in order for the light emitting element to be driven by an AC power source available in a household, a light engine for a light emitting element should include a separate circuit such as a switching mode power supply (SMPS) or the like. This poses a problem in that the drive circuit of an illumination device becomes complex and the manufacturing cost increases.

Furthermore, the light emitting element generates heat when driven. In order to solve a problem of short circuit caused by heat, it is necessary to provide a heat dissipation body under a substrate on which the light emitting element is mounted. In the case of using a heat dissipation body made of metal, there is a need to perform an additional process for preventing occurrence of short circuit in the substrate when bonding the heat dissipation body to the substrate.

SUMMARY

In view of the technical problem mentioned above, it is an object of the present invention to provide a light engine for a light emitting element, which is configured by bonding a plurality of substrates together.

Another object of the present invention is to provide a light engine for a light emitting element, which is capable of maintaining insulation between substrates bonded together and capable of preventing leakage of a current to the outside.

In accordance with one aspect of the present invention, there is provided a light engine for a light emitting element, including: an element substrate on which a plurality of light emitting elements are mounted; circuit substrates contacting one another in an insulated state in order to apply a drive voltage to the light emitting elements and contacting the element substrate in an insulated state; and protection substrates surrounding and contacting the element substrate and the circuit substrates in an insulated state.

In the light engine, the circuit substrates may include a first circuit substrate and a second circuit substrate divided from each other, disposed to make contact with the element substrate and configured to apply voltages of opposite polarities to the light emitting elements.

In the light engine, the circuit substrates may include a third circuit substrate configured to make simultaneous contact with the first circuit substrate and the second circuit substrate at the opposite side of the first circuit substrate and the second circuit substrate from the element substrate.

In the light engine, the protection substrates may include a first protection substrate which makes simultaneous contact with one side surface of the element substrate, one side surface of each of the first circuit substrate and the second circuit substrate and one side surface of the third circuit substrate, and a second protection substrate which makes simultaneous contact with the other side surface of the element substrate, the other side surface of each of the first circuit substrate and the second circuit substrate and the other side surface of the third circuit substrate.

In the light engine, the protection substrates may include a third protection substrate installed between the first protection substrate and the second protection substrate so as to make contact with the third circuit substrate.

The light engine may further include: a protection layer formed over at least a partial region of a bottom surface of the light engine including the element substrate, the circuit substrates and the protection substrates.

In the light engine, the element substrate may include an inwardly-depressed cavity formed on an upper surface of the element substrate to accommodate the light emitting elements.

In the light engine, the first protection substrate or the second protection substrate may have a fastening hole configured to fasten the first protection substrate or the second protection substrate.

According to the present invention, the light engine is configured by bonding a plurality of substrates together while maintaining insulation. It is therefore possible to prevent leakage of a current to the outside. A heat dissipation layer is selectively formed only on the substrate that serves as a drive circuit which is required to have a heat dissipation function. This makes it possible to simplify the manufacturing process of the light engine.

DETAILED DESCRIPTION OF EMBODIMENTS

The following disclosure merely illustrates the principle of the invention. While not explicitly described or illustrated in the subject specification, it may be possible to invent different devices which realize the principle of the invention and which fall within the conception and scope of the invention. Furthermore, all the conditional terms and embodiments disclosed herein are essentially intended to facilitate understanding of the concept of the invention. It is to be understood that the embodiments and states specifically described herein are not limitative.

The above objects, features and advantages will become more apparent from the following detailed descriptions given in conjunction with the accompanying drawings. Thus, a person having an ordinary knowledge in the technical field to which the invention pertains will be able to easily carry out the technical concept of the invention.

In describing the invention, if it is determined that the detailed descriptions on the prior art related to the invention may unnecessarily make obscure the spirit of the invention, the descriptions will be omitted. Hereinafter, some preferred embodiments of the present invention will be described in detail with reference to the accompanying drawings.

Figure 1:
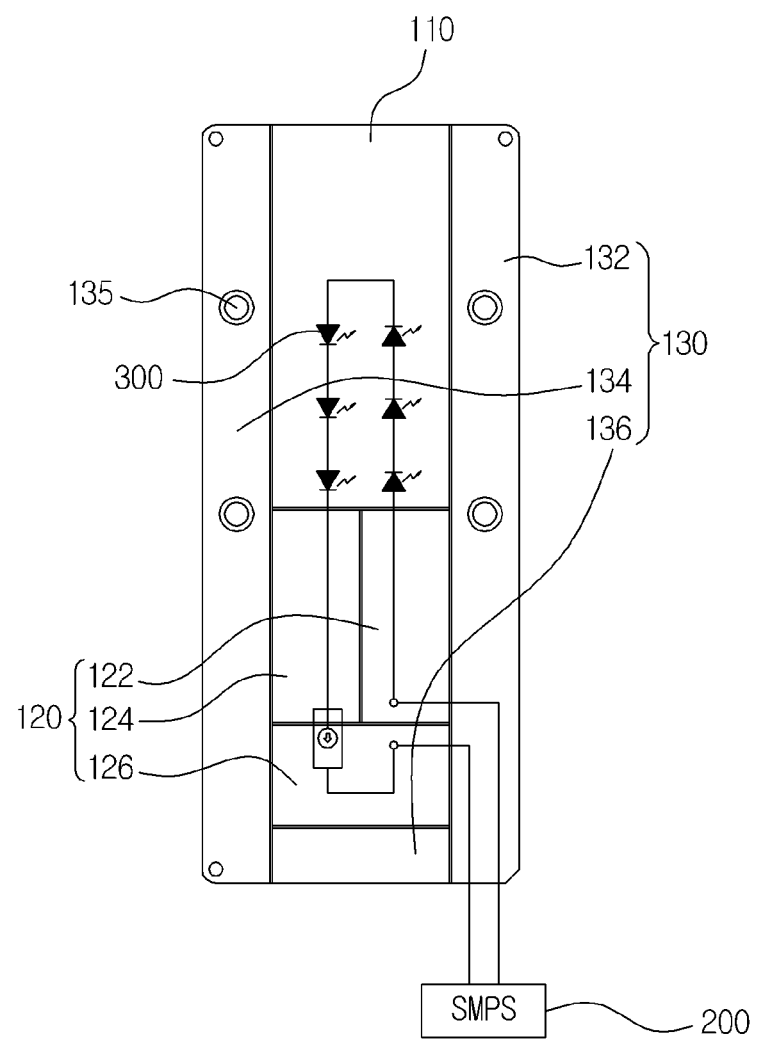
FIG. 1 is a view illustrating a light engine for a light emitting element according to one embodiment of the present invention.

FIG. 1 is a view illustrating a light engine for a light emitting element 300 (hereinafter simply referred to as "light engine") according to one embodiment of the present invention.

Referring to FIG. 1, the light engine according to the present embodiment includes an element substrate 110, a plurality of circuit substrates 120 (122, 124 and 126), a plurality of protection substrates 130 (132, 134 and 136) and a switching mode power supply 200.

In the present embodiment, a plurality of light emitting elements 300 is mounted on the element substrate 110. In the present embodiment, the light emitting elements 300 may be mounted on the element substrate 110 in groups. That is to say, the light emitting elements 300 such as light emitting diodes or the like may be mounted on the element substrate 110 in groups and may be connected to one another in series, in parallel or both.

Figure 2:
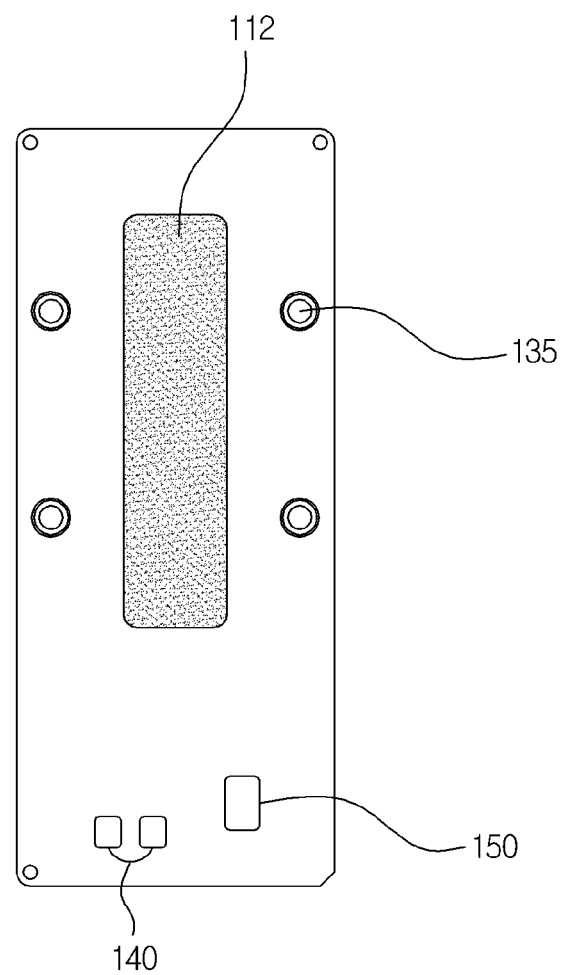
FIG. 2 is a view illustrating the upper surface of the light engine for a light emitting element according to one embodiment of the present invention.

The light emitting elements 300 used at this time can be divided into different types depending on the positions of electrode portions to which a voltage is applied. In the present embodiment, for the sake of convenience, there is illustrated a horizontal chip type in which a P electrode and an N electrode are positioned in the lower and upper portions of an light emitting diode and are serially connected to each other as illustrated in FIG. 2. Thus, the respective light emitting elements 300 illustrated in FIG. 1 receive a voltage by making contact with the element substrate 110. The element substrate 110 is electrically connected to one of the circuit substrates 120 which will be described later.

Furthermore, the light emitting elements 300 are electrically connected to one another by wire bonding on the upper surfaces thereof and are applied with a voltage. Electrodes connected to the upper surfaces of the light emitting elements 300 are connected to another of the circuit substrates 120 which will be described later.

The circuit substrates 120 of the present embodiment are connected to one another in an insulated state in order to apply a voltage to the light emitting elements 300 through circuits for driving the light emitting elements 300. The circuit substrates 120 are connected to the element substrate 110 in an insulated state.

Referring to FIG. 1, the circuit substrates 120 are bonded to the lower region of the element substrate 110 on which the light emitting elements 300 are mounted. The circuit substrates 120 are divided and bonded to each other at a widthwise central portion of the element substrate 110.

The circuit substrates 120 include a first circuit substrate 122 and a second circuit substrate 124 divided from each other and disposed to make contact with the element substrate 110. The first circuit substrate 122 and the second circuit substrate 124 are configured to apply voltages of opposite polarities to the light emitting elements 300. One of the first circuit substrate 122 and the second circuit substrate 124 applies a positive voltage to the light emitting elements 300. The other of the first circuit substrate 122 and the second circuit substrate 124 applies a negative voltage to the light emitting elements 300. Circuits may be formed within the first circuit substrate 122 and the second circuit substrate 124. Alternatively, the first circuit substrate 122 and the second circuit substrate 124 may serve as circuits having a wide area. This makes it possible to realize a function of dissipating the heat of a drive circuit.

Referring again to FIG. 1, the circuit substrates 120 may include a third circuit substrate 126 that makes simultaneous contact with the first circuit substrate 122 and the second circuit substrate 124 at the opposite side of the first circuit substrate 122 and the second circuit substrate 124 from the element substrate 110.

That is to say, the upper surfaces of the first circuit substrate 122 and the second circuit substrate 124 are connected to the element substrate 110 in order to apply voltages to the element substrate 110. The bottom surfaces of the first circuit substrate 122 and the second circuit substrate 124 are connected to the third circuit substrate 126 having the same width as the element substrate 110.

Specifically, the third circuit substrate 126 makes contact with the second circuit substrate 124. A drive integrated circuit 140 may be disposed on the surface where the third circuit substrate 126 makes contact with the second circuit substrate 124. That is to say, as illustrated in FIG. 2, the drive integrated circuit 140 may be formed on the surface where the third circuit substrate 126 makes contact with the second circuit substrate 124.

In the present embodiment, one drive integrated circuit 140 is installed as illustrated in FIG. 1. However, in order to increase the amount of a current flowing through the circuits, a plurality of drive integrated circuits may be installed and serially connected by adjusting the size (width) of the second circuit substrate 124. In the case of the elements which need to be connected in series, it is possible to serially connect the elements by forming a plurality of vertically-extending insulation layers in the second circuit substrate 124.

That is to say, the circuit substrates 120 according to the present embodiment may be configured to serve as circuits by adjusting the width thereof depending on the substrate design.

The drive integrated circuit 140 is configured to assist in constant current drive. The output of a light emitting diode is usually proportional to a current. Thus, a constant current is required in order to maintain a predetermined level of brightness. The drive integrated circuit 140 serves to control an input voltage using the relationship between the constant current, the input voltage and the equivalent resistance of a circuit.

In the present embodiment, the drive integrated circuit 140 is a circuit for controlling the drive of the light emitting elements 300 mounted on the element substrate 110. The drive integrated circuit 140 is configured to determine the level of an applied voltage and to selectively turn on or off the light emitting elements 300 depending on the level of a voltage thus determined.

Furthermore, in the present embodiment, a connector 150 for connecting the circuit substrates 120 to the external switching mode power supply 200 may be installed on the circuit substrates 120.

In general, the light emitting elements 300 can be driven only by a DC power source due to the diode characteristics thereof. Thus, in order for the light emitting elements 300 to be driven by an AC power source, it is necessary to employ a separate circuit such as the switching mode power supply 200 or the like. In the present embodiment, the second circuit substrate 124 and the third circuit substrate 126 are connected to the switching mode power supply 200 via the connector 150.

In the present embodiment, the protection substrates 130 is configured to surround the element substrate 110 and the circuit substrates 120 and to make contact with the element substrate 110 and the circuit substrates 120 in an insulated state.

In the present embodiment, the protection substrates 130 serve to prevent the circuit substrates 120 from making contact with an external component and being short-circuited. Furthermore, the protection substrates 130 serve to prevent a current from being leaked to the outside. More specifically, the protection substrates 130 perform an insulation function and a shock absorbing function. The protection substrates 130 are provided with fastening holes 135 to which an external heat dissipation plate and an external article are fastened.

In the present embodiment, the protection substrates 130 include a first protection substrate 132 and a second protection substrate 134, each of which has fastening holes 135 for fastening the light engine to a heat sink or the like.

More specifically, as illustrated in FIG. 1, the protection substrates 130 includes a first protection substrate 132 which makes simultaneous contact with one side surface of the element substrate 110, one side surface of each of the first circuit substrate 122 and the second circuit substrate 124 and one side surface of the third circuit substrate 126, and a second protection substrate 134 which makes simultaneous contact with the other side surface of the element substrate 110, the other side surface of each of the first circuit substrate 122 and the second circuit substrate 124 and the other side surface of the third circuit substrate 126.

Furthermore, the protection substrates 130 may include a third protection substrate 136 installed between the first protection substrate 132 and the second protection substrate 134 so as to make contact with the third circuit substrate 126. That is to say, as illustrated in FIG. 1, the first protection substrate 132 and the second protection substrate 134 are configured to protect the side surfaces of the element substrate 110 and the circuit substrates 120. The third protection substrate 136 is configured to protect the lower end of the circuit substrates 120 exposed to the outside.

In addition, some components of the switching mode power supply 200 (e.g., the drive integrated circuit 140 or the general integrated circuit which requires a heat dissipation property) may be mounted on the substrate of the light engine. This makes it possible to improve the heat dissipation characteristics of components, thereby improving the overall operation efficiency of the light engine.

That is to say, different kinds of components may be mounted on the element substrate 110 depending on the module design. Accordingly, it is possible to reduce the volume and necessity of the heat dissipation components of the switching mode power supply 200 that requires an additional heat dissipation function. This makes it possible to use the switching mode power supply 200 having a reduced weight and a small size. Furthermore, a larger number of components can be mounted on the element substrate 110 by additionally forming a vertical insulation layer in the element substrate 110.

The circuit substrates 120 will now be described in detail with reference to FIG. 2.

FIG. 2 illustrates an example in which the light engine is subjected to a surface treatment and is provided with additional components. A white layer may be formed on the upper surface of the light engine for the purpose of a light emitting function. In this case, the white layer may be formed of a white solder resist.

Furthermore, in the present embodiment, the element substrate 110 may further include an inwardly-depressed cavity 112 formed on the upper surface thereof and configured to mount the light emitting elements 300. In FIG. 2, the cavity 112 is a groove inwardly depressed from one surface of the element substrate 110.

In this case, the cavity 112 may be formed of a groove having a width which grows smaller downward, so that the cavity 112 can serve as a lens which reflects the light emitted from the light emitting elements 300. It is also possible to additionally form a phosphor body or a metal plating layer on the cavity 112, thereby increasing the light reflection performance. The metal plating layer may be formed of the combination of a base metal layer made of Ag, Ni, Cr or Au and a base metal layer made of Cu, Sn, Pd or Zn Referring to FIG. 4 or 6, the circuit substrates 120 may further include a mounting groove 127 for mounting different kinds of elements.

In the case where the mounting component such as the drive integrated circuit 140 or the like is mounted on the surface of the element substrate 110 by being soldered, the mounting component may interfere with the light generated from the light emitting elements 300 such as light emitting diodes or the like and may be weakened by the external force during the handling thereof.

Thus, in the present embodiment, the mounting groove 127 is formed so that the circuit elements do not protrude beyond the surface of the element substrate 110.

A protection layer 160 of the light engine according to the present embodiment will now be described in detail with reference to FIGS. 3 to 6.

Figure 3:
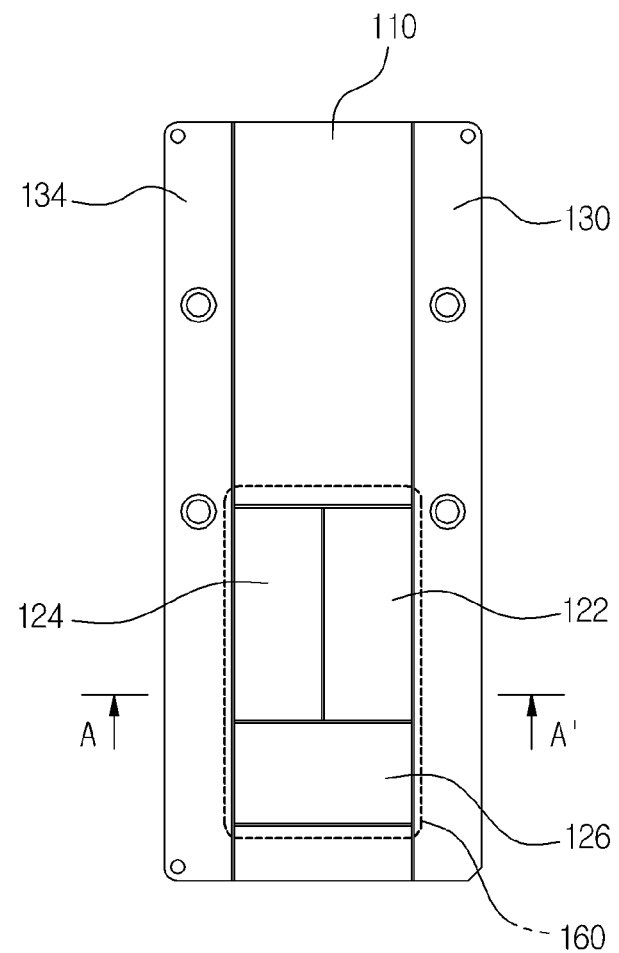
FIG. 3 is a view illustrating the bottom surface of the light engine for a light emitting element according to one embodiment of the present invention.

Referring to FIG. 3, the protection layer 160 according to the present embodiment is formed over at least a partial region of the bottom surface of the light engine including the element substrate 110, the circuit substrates 120 and the protection substrates 130.

Figure 4:
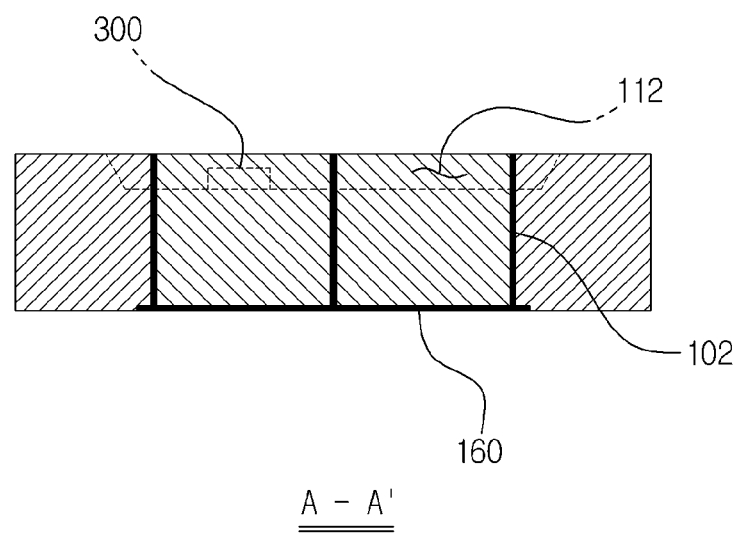
FIG. 4 is a view illustrating a cross section of the light engine for a light emitting element illustrated in FIG. 3.

The protection layer 160 may be made of a material for insulation and heat dissipation of the circuits of the circuit substrates 120. FIG. 4 is a sectional view of the light engine taken along line A-A' in FIG. 3. The protection layer 160 may be formed so as to cover the groove of the region including the vertically-extending insulation layer.

Figure 5:
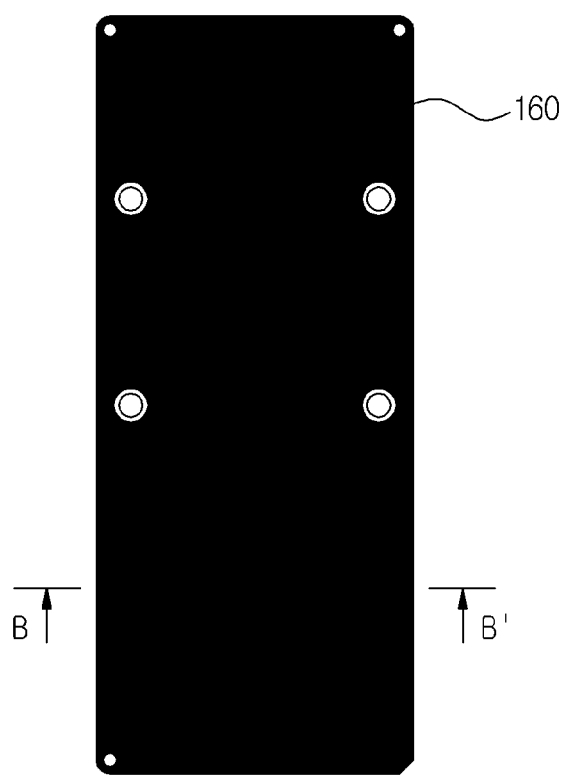
FIG. 5 is a view illustrating the bottom surface of the light engine for a light emitting element according to another embodiment of the present invention.
Figure 6:
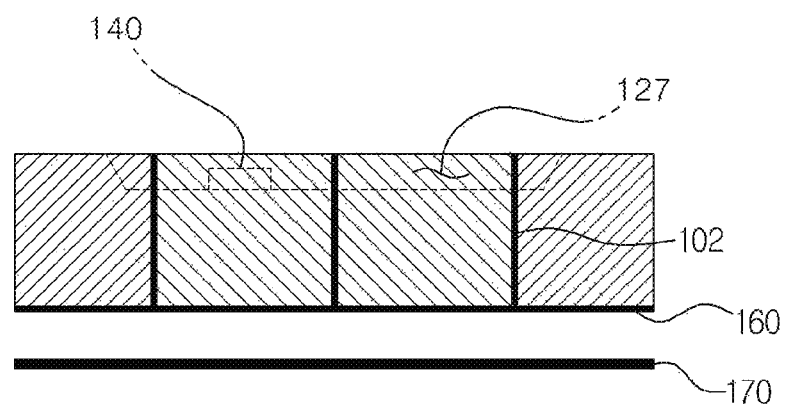
FIG. 6 is a view illustrating a cross section of the light engine for a light emitting element illustrated in FIG. 5.

Alternatively, as illustrated in FIG. 5, the protection layer 160 may be formed in such a fashion as to cover the entire bottom surfaces of the substrates that constitute the light engine. Referring to FIG. 6 which is a sectional view taken along line B-B' in FIG. 5, the protection layer 160 may be formed in such a fashion as to fill the vertically-extending grooves and to cover the entire surfaces of the substrates.

Furthermore, a metal substrate 170 for heat diffusion may be additionally attached to the protection layer 160, thereby increasing the heat dissipation performance.

According to the present invention described above, the light engine is configured by bonding a plurality of substrates together while maintaining insulation. It is therefore possible to prevent leakage of a current to the outside. The heat dissipation layer is selectively formed only on the substrate that serves as a drive circuit which is required to have a heat dissipation function. This makes it possible to simplify the manufacturing process of the light engine.

The forgoing descriptions are mere illustration of the technical idea of the present invention. A person having an ordinary knowledge in the technical field to which the invention pertains will be able to make modifications, changes and substitutions without departing from the essential features of the invention.

Accordingly, the embodiments and the accompanying drawings disclosed herein are not intended to limit the technical concept of the present invention but are intended to describe the present invention. The technical concept of the present invention shall not be limited by the embodiments and the accompanying drawings. The protection scope of the present invention shall be construed on the basis of the appended claims. All the technical concepts which are equivalent in scope to the claims shall be construed to fall within the scope of the present invention.

What is claimed is:

1. A light engine for light emitting elements, comprising:
   an element substrate on which a plurality of light emitting elements are mounted;
   circuit substrates contacting one another in an insulated state in order to apply a drive voltage to the light emitting elements and contacting the element substrate in an insulated state; and
   protection substrates surrounding and contacting the element substrate and the circuit substrates in an insulated state;
   wherein the circuit substrates include a first circuit substrate and a second circuit substrate divided from each other, disposed to make contact with the element substrate and configured to apply voltages of different polarities to the light emitting elements, and
   wherein the circuit substrates include a third circuit substrate configured to make simultaneous contact with the first circuit substrate and the second circuit substrate at the opposite side of the first circuit substrate and the second circuit substrate from the element substrate.

2. The light engine of claim 1, wherein the protection substrates include a first protection substrate which makes simultaneous contact with one side surface of the element substrate, one side surface of the first circuit substrate or the second circuit substrate and one side surface of the third circuit substrate, and a second protection substrate which makes simultaneous contact with the other side surface of the element substrate, the other side surface of each of the first circuit substrate and the second circuit substrate and the other side surface of the third circuit substrate.

3. The light engine of claim 2, wherein the protection substrates include a third protection substrate installed between the first protection substrate and the second protection substrate so as to make contact with the third circuit substrate.

4. The light engine of claim 3, further comprising:
   a protection layer formed over at least a partial region of a bottom surface of the light engine including the element substrate, the circuit substrates and the protection substrates.

5. The light engine of claim 1, wherein the element substrate includes an inwardly-depressed cavity formed on an upper surface of the element substrate to accommodate the light emitting elements.

6. The light engine of claim 2, wherein the first protection substrate or the second protection substrate has a fastening hole configured to fasten the first protection substrate or the second protection substrate.

* * * * *